(12) United States Patent
Tsai

(10) Patent No.: US 6,181,209 B1
(45) Date of Patent: Jan. 30, 2001

(54) ALL-DIGITAL FREQUENCY FOLLOWING SYSTEM

(75) Inventor: Chao-Ming Tsai, Taipei (TW)

(73) Assignee: Winbond Electronics Corp., Hsinchu (TW)

(*) Notice: Under 35 U.S.C. 154(b), the term of this patent shall be extended for 0 days.

(21) Appl. No.: 09/206,189

(22) Filed: Dec. 4, 1998

(51) Int. Cl.$^7$ ....................................................... H03L 7/00
(52) U.S. Cl. ............................ 331/1 A; 331/25; 360/51; 375/376; 327/159; 327/160
(58) Field of Search ........................ 360/51, 57; 331/1 A, 331/25; 327/160, 159; 375/376

(56) References Cited

U.S. PATENT DOCUMENTS 4,380,742 * 4/1983 Hart ....................................... 331/1 A
6,115,443 * 9/2000 Wu et al. ................................ 377/47

* cited by examiner

Primary Examiner—Arnold Kinkead
(74) Attorney, Agent, or Firm—Jiawei Huang; J C Patents

(57) ABSTRACT

An all-digital frequency following system is provided, which is capable of generating an output frequency which can be either an integral or an irrational multiple of an input frequency. The frequency following system is constructed entirely based on digital devices. It includes a frequency counter, a digital comparator, an up/down counter, and a digitally-controlled oscillator. The frequency counter is used to count the output frequency during each period of the input frequency. At the end of each period of the input frequency, the digital comparator will compare the current output of the frequency counter with a preset reference value to thereby generate a corresponding up/down trigger signal. The up/down counter is set at an initial count which is increased or decreased by one in response to the up/down trigger signal from the digital comparator. The digitally-controlled oscillator is capable of generating an output signal serving as the desired output frequency which is proportional to the output of said up/down counter. The reference value set to the digital comparator is equal to the ratio of the desired output frequency to the input frequency. In the case of irrational multiplication, the frequency following system further includes two frequency dividers that allow the ratio of the desired output frequency to the input frequency to be related to three parameters: the reference value set to the digital comparator and the frequency divisors of these two frequency dividers.

8 Claims, 4 Drawing Sheets

ALL-DIGITAL FREQUENCY FOLLOWING SYSTEM

BACKGROUND OF THE INVENTION

1. Field of the Invention

This invention relates to CD-ROM (compact-disc read-only memory) drive systems, and more particularly, to an all-digital frequency following system which is constructed entirely based on digital circuit elements for use on a high-performance CD-ROM drive system with an operating frequency of above 40 megahertz (MHz).

2. Description of Related Art

During the operation of a CD-ROM drive system, a decoder is used to receive data from a digital signal processor (DSP) and then store the received data in a memory unit, such as a dynamic random access memory (DRAM) unit. To allow the CD-ROM drive system to operate with high performance, it requires the provision of a reference clock signal of a high frequency that can be stably maintained at the desired level.

In conventional CD-ROM drive systems, the reference clock signal is usually generated by a crystal oscillator whose output frequency or a multiple thereof is used as the clock signal. Conventionally, the multiplication of the output frequency of the crystal oscillator is achieved by using a phase-lock loop (PLL) circuit. In addition, high frequency generators or analog PLL devices can be used to directly obtain the desired high frequency.

One drawback to the use of the above-mentioned analog means to generate the high-frequency reference clock signal, however, is that the circuit will be complex in structure and poor in stability. Since most of modern electronic devices are based on digital circuits, there exists, therefore, a need for an all-digital frequency following system which is constructed entirely based on digital circuit elements and capable of generating an output frequency which can be either an integral or an irrational multiple of an input frequency.

SUMMARY OF THE INVENTION

It is therefore an objective of the present invention to provide an all-digital frequency following system which can be implemented with fewer than 500 silicon gates on the integrated circuit thereof.

It is another objective of the present invention to provide an all-digital frequency following system which is constructed entirely based on digital circuit elements.

It is still another objective of the present invention to provide an all-digital frequency following system which is capable of generating an output frequency which can be either an integral or an irrational multiple of an input frequency.

It is yet another objective of the present invention to provide an all-digital frequency following system which can be constructed based on low-frequency transistors.

In accordance with the foregoing and other objectives of the present invention, an all-digital frequency following system is provided. Two preferred embodiments of the invention are disclosed.

In the first preferred embodiment, the frequency following system of the invention is capable of generating an output frequency which is, in particular, an integral multiple of an input frequency. Broadly speaking, the frequency following system of this embodiment includes the following constituent parts:

(a) a frequency counter having a first input end receiving said input frequency as a reset signal which resets said frequency counter at the start of each cycle of the input frequency and a second input end receiving the output frequency of said frequency following system as a feedback to thereby count the number of pulses in the output frequency, said frequency counter holding the output count when the count reaches a preset upper limit;

(b) a digital comparator which latches the output of said frequency counter at the start of each cycle of the input frequency and then compares the latched value with a preset reference value; said digital comparator generating an up trigger signal if the latched value is greater than the reference value, a down trigger signal if the latched value is less than the reference value;

(c) an up/down counter whose count range is set between an upper limit and a bottom limit and whose initial count is set at a predetermined value which is increased by one when the up trigger signal is received from said digital comparator and decreased by one when the down trigger signal is received from said digital comparator; when the count of said up/down counter reaches either the upper limit or the bottom limit, the output of said up/down counter is hold at that limit; and (d) a digitally-controlled oscillator capable of generating an output signal serving the output frequency whose value is in proportion to the output of said up/down counter.

In said digital comparator, the reference value is set to equal to the ratio of the desired output frequency to the input frequency. The first preferred embodiment allows the frequency following system to generate the desired output frequency which is the reference value multiple of the input frequency.

In the second preferred embodiment, the frequency following system of the invention is capable of generating an output frequency which is, in particular, a non-integral multiple of an input frequency. Broadly speaking, the frequency following system of this embodiment includes the following constituent parts:

(a) a first frequency divider, receiving the input frequency as input, for dividing the input frequency by a first integer number N;

(b) a second frequency divider, receiving the output frequency of said frequency following system as input, for dividing the output frequency of said frequency following system by a second integer number X;

(c) a frequency counter having a first input end receiving the output of said first frequency divider as a reset signal which resets said frequency counter at the start of each cycle of the output of said first frequency divider and a second input end receiving the output of said second frequency divider as a feedback to thereby count the number of pulses in the output of said second frequency divider, said frequency counter holding the output count when the count reaches a preset upper limit;

(d) a digital comparator which latches the output of said frequency counter at the start of each cycle of the output of said first frequency divider and then compares the latched value with a preset reference value K; said digital comparator generating an up trigger signal if the latched value is greater than the reference value, a down trigger signal if the latched value is less than the reference value;

(e) an up/down counter whose count range is set between an upper limit and a bottom limit and whose initial count is set at a predetermined value which is increased by one when the up trigger signal is received from said digital comparator and decreased by one when the down trigger signal is received from said digital comparator; when the count of said up/down counter reaches either the upper limit or the bottom limit, the output of said up/down counter is hold at that limit; and (f) a digitally-controlled oscillator capable of generating an output signal serving the output frequency whose value is in proportion to the output of said up/down counter.

The irrational multiplier is equal to K·X/N. Suitable values can be selected for N, X, and K that allow the value of K·X/N to be equal to the desired ratio of the resultant output frequency to the input frequency.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
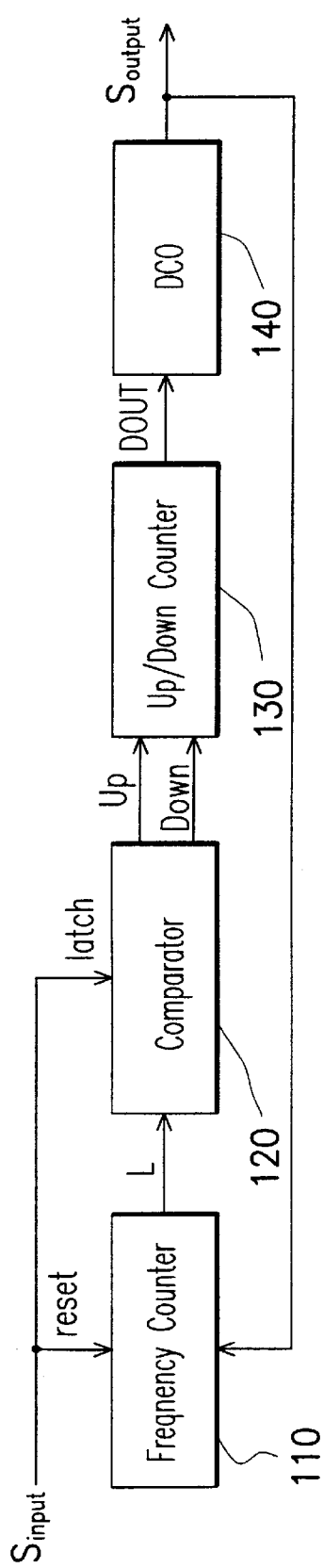
FIG. 1 is a schematic block diagram of a first preferred embodiment of the all-digital frequency following system of the invention.

FIG. 1 is a schematic block diagram of a first preferred embodiment of the all-digital frequency following system according to the invention. As shown, the all-digital frequency following system of this embodiment includes a frequency counter 110, a digital comparator 120, an up/down counter 130, and a digitally-controlled oscillator (DCO) 140 whose output frequency is proportional to the value of the binary output DOUT of the up/down counter 130. Initially, the DOUT is set at a predetermined value so as to cause the DCO 140 to generate an output frequency $S_{output}$ at a predetermined level; and the content L of the frequency counter 110 is set to 0. The output frequency $S_{output}$ of the DCO 140 serves as the output frequency of the frequency following system.

The output frequency $S_{output}$ is fed back to the frequency counter 110 which adds one to its count each time one pulse appears in the output frequency $S_{output}$. The frequency counter 110 will be reset to 0 at the start of each cycle of the input frequency $S_{input}$. In other words, the frequency counter 110 is capable of counting the number of pulses in the output frequency $S_{output}$ during each period of the output frequency $S_{output}$. This number represents the ratio of the current output frequency $S_{output}$ to the input frequency $S_{input}$. The output L of the frequency counter 110 is then transferred to the digital comparator 120. At the start of the next cycle of the input frequency $S_{input}$, it will cause the digital comparator 120 to latch the current output L of the frequency counter 110 as a latched value $L_{Latch}$ therein, and meanwhile cause to the frequency counter 110 to be reset to 0. The digital comparator 120 then compares the latched value $L_{Latch}$ with a predetermined reference value K, where K is the ratio of the desired level of the output frequency $S_{output}$ to the input frequency $S_{input}$. The K value can be preprogrammed into the digital comparator 120.

If $L_{Latch}$>K (which indicates that the current output frequency $S_{output}$ is larger than the desired level), the digital comparator 120 will output an Up trigger signal to the up/down counter 130, which triggers the up/down counter 130 to count in the up direction. The output DOUT of the up/down counter 130 is thus increasing, which will in turn cause the DCO 140 to lower the current output frequency $S_{output}$ which is then fed back to the frequency counter 110. This feedback control continues until the output frequency $S_{output}$ is lowered to the desired level (i.e., when $L_{Latch}$=K).

If $L_{Latch}$ <K (which indicates that the current output frequency $S_{output}$ is below the desired level), the digital comparator 120 will output a Down trigger signal to the up/down counter 130, which triggers the up/down counter 130 to count in the down direction. The output DOUT of the up/down counter 130 is thus decreasing, which will in turn cause the DCO 140 to increase the current output frequency $S_{output}$. This feedback control continues until the output frequency $S_{output}$ is raised to the desired level (i.e., when $L_{Latch}$=K).

If $L_{Latch}$=K (which indicates that the current output frequency $S_{output}$ is exactly at the desired level), the digital comparator 120 will output no up/down trigger signal to the up/down counter 130, whereby the up/down counter 130 will maintain its output DOUT at the current value, allowing the DCO 140 to maintain the output frequency $S_{output}$ at its current level.

Through the foregoing feedback control, the finally resultant output frequency $S_{output}$ will be substantially equal to an integral multiple (i.e., K times) of the input frequency $S_{input}$.

Figure 3:
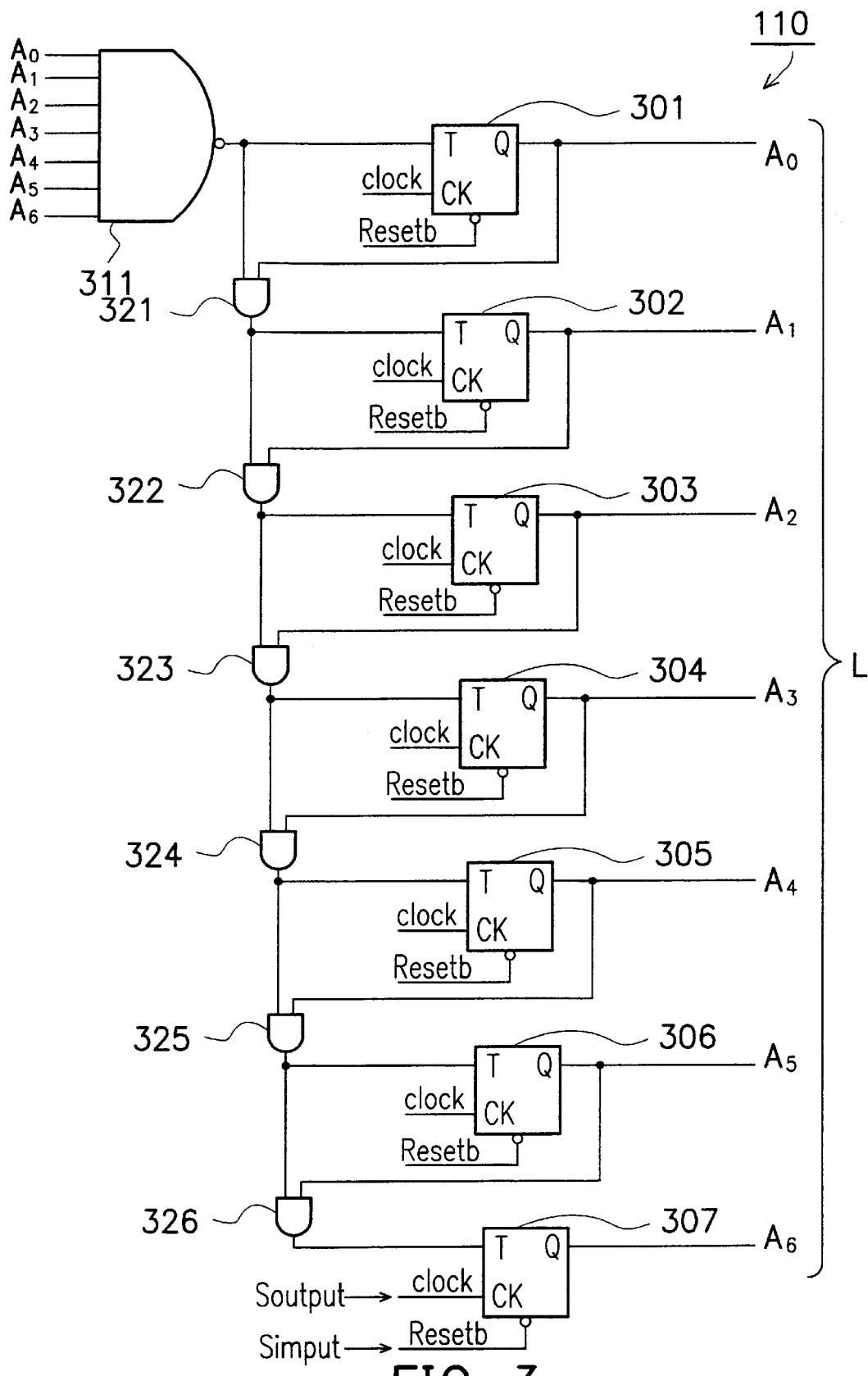
FIG. 3 is a schematic circuit diagram of a frequency counter utilized in the all-digital frequency following system of the invention.

FIG. 3 is a schematic circuit diagram of the frequency counter 110 utilized in the all-digital frequency following system of FIG. 1. In the preferred embodiment, the frequency counter of FIG. 3 is composed of seven sequentially-connected T-type flip-flops 301, 302, 303, 304, 305, 306, 307 having output bits $A_0, A_1, A_2, A_3, A_4, A_5, A_6, A_7$, which can count in the range from 0 up to a maximum of 127; a seven-input NAND gate 311 whose inputs are respectively connected to receive the output bits $A_0$–$A_7$ from the T-type flip-flops 301, 302, 303. 304, 305, 306, 307; and a series of AND gates 321, 322, 323, 324, 325, 326. Each of the T-type flip-flops 301, 302, 303, 304, 305, 306, 307 has a CK (clock) port connected to receive the feedback output frequency $S_{output}$ from the DCO 140 (FIG. 1) and a Resetb port which is connected to receive the Reset signal generated at the start of each cycle of the input frequency $S_{input}$. The output bits $A_0$–$A_7$ in combination serve as the above-mentioned output L of the frequency counter 110.

In particular, the frequency counter of FIG. 3 is designed to hold the output when the count reaches the maximum value of 127. In this case, the output bits $A_0$–$A_7$ are all equal to 1, thus causing the output of the NAND gate 311 to become 0 (the output of the NAND gate 311 is otherwise maintains at 1). The condition of the output of the NAND gate 311 being 0 will subsequently cause the output of the AND gates 321, 322, 323, 324, 325, 326 to successively become 0. As a result, all the T inputs to the respective T-type flip-flops 301, 302, 303, 303, 305, 306, 307 are all switched to the logic state 0, thus causing them to maintain their output bits $A_0$–$A_7$ at the current logic state (i.e., the value of 127).

Assume K is set to 100 and the input frequency $S_{input}$ is 1 MHz, then the finally resultant output frequency $S_{output}$ will be 1 MHz×100=100 MHz. Since the frequency counter 110 is devised in such a manner that it will not count up beyond 127, it can prevent the digital comparator 120, when the output frequency $S_{output}$ is overly large, from misjudging that the output frequency $S_{output}$ were low due to the count of the frequency counter 110 being less than 100, for example 10.

Figure 4:
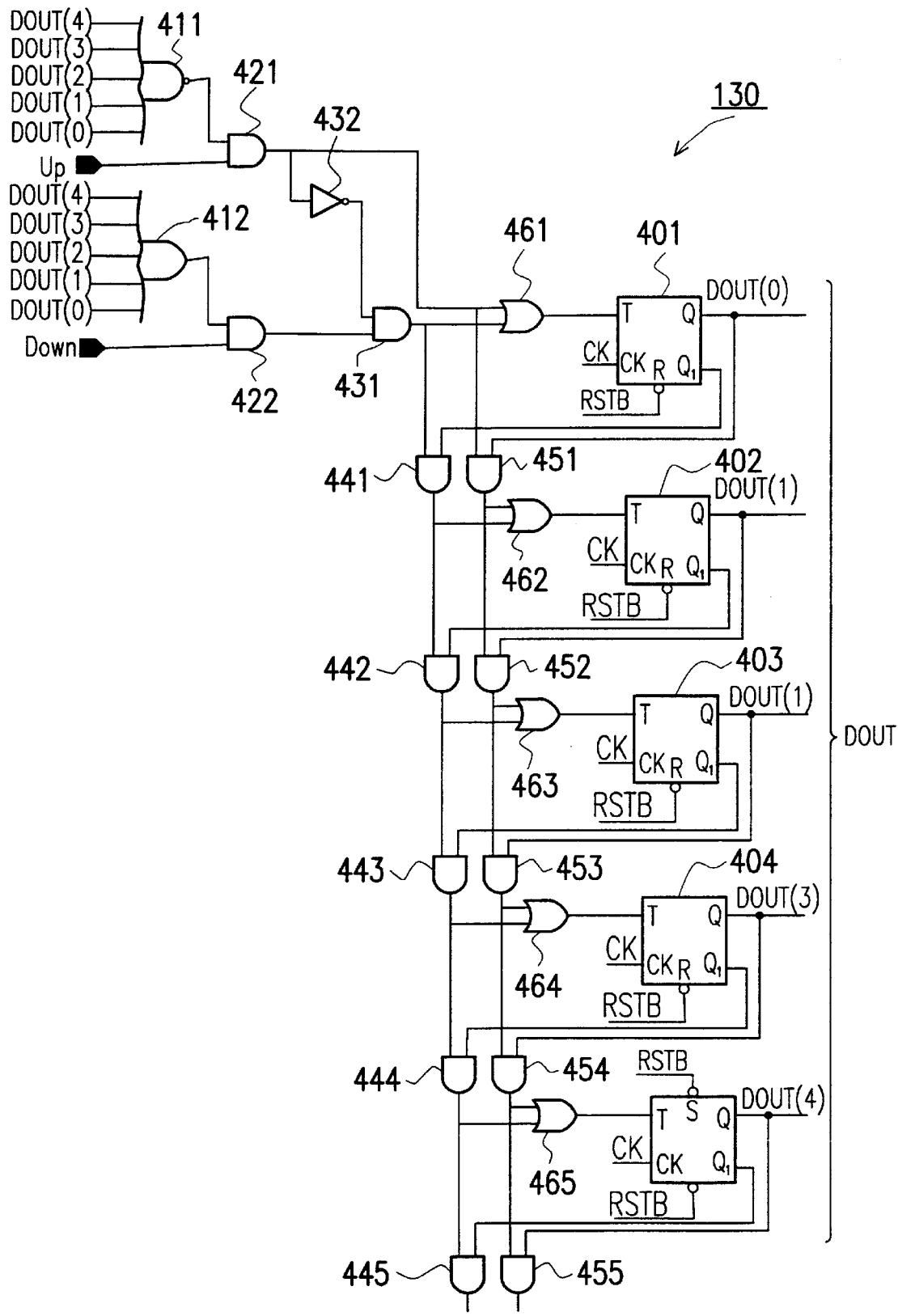
FIG. 4 is a schematic circuit diagram of an up/down counter utilized in the all-digital frequency following system of the invention.

FIG. 4 is a schematic circuit diagram of the up/down counter 130 utilized in the all-digital frequency following system of FIG. 1. As shown, the up/down counter 130 includes five sequentially-connected T-type flip-flops 401, 402, 403, 404, 405 having output bits DOUT(0), DOUT(1), DOUT(2), DOUT(3), DOUT(4) that allow the up/down counter 130 to count in the range from 0 to 31. Further, the up/down counter 130 includes a five-input NAND gate 411 and a five-input OR gate 412 whose input ends are connected respectively to receive the output bits DOUT(0), DOUT(1), DOUT(2), DOUT(3), DOUT(4) from the T-type flip-flops 401, 402, 403, 404, 405; an AND gate 421 having a first input end connected to receive the output of the NAND gate 411 and a second input end connected to receive the Up trigger signal from the digital comparator 120 (FIG. 1); and an AND gate 422 having a first input end connected to receive the output of the OR gate 412 and a second input end connected to receive the Down trigger signal from the digital comparator 120 (FIG. 1). An AND gate 431 has a first input end connected via an inverter 432 to receive an inverted version of the output of the AND gate 421 and a second input end connected to receive the output of the AND gate 422. Further, a first series of AND gates 441, 442, 443, 444, 445 are connected in relation to the down count mode of the up/down counter 130; and a second series of AND gates 451, 452, 453, 454, 455 are connected in relation to the up count mode of the up/down counter 130. Further, a series of OR gates 461, 462, 463, 464, 465 are respectively connected to the AND gate 421, the AND gate 431, and the first and second series of AND gates 441, 442, 443, 444, 445, 451, 452, 453, 454, 455. The outputs of these OR gates 461, 462, 463, 464, 465 are used to control the operation of the T-type flip-flops 401, 402, 403, 404, 405.

The foregoing arrangement of the logic circuitry allow the up/down counter 130 to count in the up direction when the Up trigger signal is set at the logic state 1, and in the down direction when the Down trigger signal is set at the logic state 1.

Moreover, when operating in the up counting mode (i.e., Up=1, Down=0), the up/down counter 130 will hold the output when the count reaches the maximum value of 31. In this case, the output bits output bits DOUT(0), DOUT(1), DOUT(2), DOUT(3), DOUT(4) are all equal to 1, thus causing the output of the NAND gate 411 to become 0 (the output of the NAND gate 311 is otherwise maintains at 1). The condition of the output of the NAND gate 311 being 0 will subsequently cause the output of the AND gates 451, 452, 453, 454, 455 to successively become 0. At this time, since Down=0 which causes the AND gates 431, 441, 442, 443, 444 to output 0, the OR gates 461, 462, 463, 464, 465 all output 0, thus causing the T-type flip-flops 401, 402, 403, 404, 405 to maintain the output bits output bits DOUT(0), DOUT(1), DOUT(2), DOUT(3), DOUT(4) at the current logic state (i.e., the maximum value 31).

In a similar manner, when operating in the down counting mode (i.e., Down=1, Up=0), the up/down counter 130 will hold the output when the count reaches the minimum value of 0. In this case, the output bits output bits DOUT(0), DOUT(1), DOUT(2), DOUT(3), DOUT(4) are all equal to 0, thus causing the output of the OR gate 412 to become 0 (the output of the OR gate 412 is otherwise maintains at 1). The condition of the output of the OR gate 412 being 0 will subsequently cause the output of the AND gates 431, 441, 442, 443, 444 to successively become 0. At this time, since Up=0 which causes the AND gates 421, 451, 452, 453, 454 to output 0, the OR gates 461, 462, 463, 464, 465 all output 0, thus causing the T-type flip-flops 401, 402, 403, 404, 405 to maintain the output bits output bits DOUT(0), DOUT(1), DOUT(2), DOUT(3), DOUT(4) at the current logic state (i.e., the minimum value 0).

In this preferred embodiment, the initial output of the up/down counter 130 is set at 16, which is the midpoint value between 0 and 31. Since in either mode of operation, the output of the up/down counter 130 will not count to below 0 or above 31, the variation of the output frequency $S_{output}$ can be maintained within an allowable range set by the designer.

Figure 5:
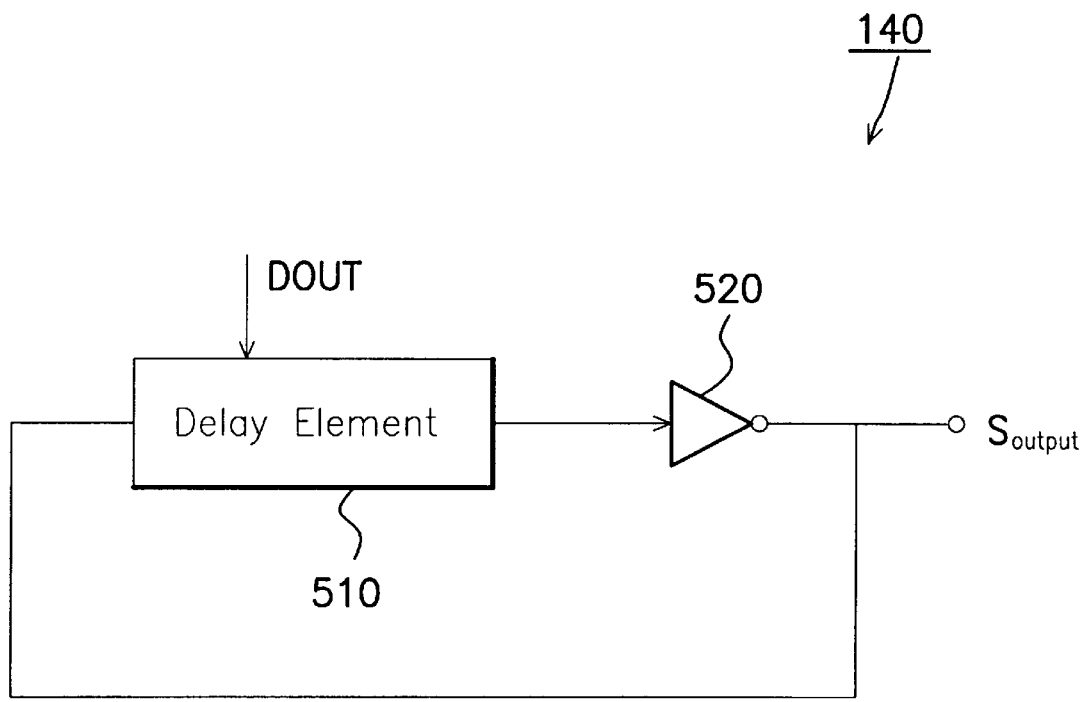
FIG. 5 is a schematic circuit diagram of a digitally-controlled oscillator (DCO) utilized in the all-digital frequency following system of the invention.

FIG. 5 is a schematic circuit diagram of the DCO 140 utilized in the all-digital frequency following system of FIG. 1. As shown, the DCO 140 includes a delay element 510 and an inverter 520 coupled to the output of the delay element 510. The output of the inverter 520 is taken as the output frequency $S_{output}$. The delay element 510 operates in such a manner that the delay time caused thereby is proportional to the value of DOUT. When the value of DOUT is increasing due to the up/down counter 130 operating in the up counting mode, the delay time caused by the delay element 510 is correspondingly increased, thereby causing a decrease in the frequency of the output frequency $S_{output}$. By contrast, when the value of DOUT is decreasing due to the up/down counter 130 operating in the down counting mode, the delay time caused by the delay element 510 is correspondingly decreased, thereby causing an increase in the output frequency $S_{output}$.

The foregoing preferred embodiment allows the frequency following system to generate an output frequency which is an integral multiple (i.e., the value of K) of the input frequency. In addition, a second preferred embodiment of the invention will be disclosed in the following, which is capable of generating an output frequency which can be an irrational multiple of the input frequency.

Figure 2:
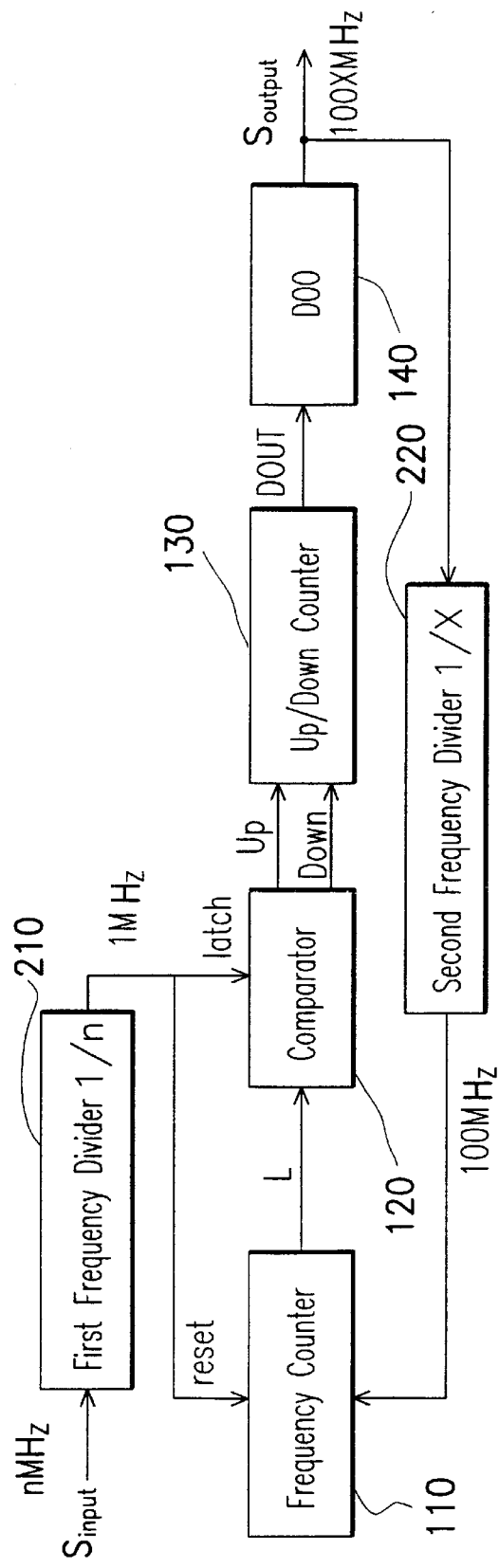
FIG. 2 is a schematic block diagram of a second preferred embodiment of the all-digital frequency following system of the invention.

FIG. 2 is a schematic block diagram of a second preferred embodiment of the all-digital frequency following system of the invention. As shown, the all-digital frequency following system of this embodiment differs from the previous embodiment only in that it further includes a first frequency divider 210 connected to receive the input frequency $S_{input}$ and a second frequency divider 220 connected between the output of the DCO 140 and the input of the frequency counter 110. In FIG. 2, the elements that are identical in structure and function as those shown in FIG. 1 are labeled with the same reference numerals. The first frequency divider 210 is used to divide the input frequency $S_{input}$ by N, while the second frequency divider 220 is used to divide the output frequency $S_{output}$ by X, where N and X are integers.

Assume the reference value set to the digital comparator is K=100, the input frequency $S_{input}$ is N MHz, and the desired output frequency $S_{output}$ is 100X MHz, then the output frequency of the frequency counter 110 is 1 MHz and output frequency of the second frequency divider 220 is 100

MHz. In other words, the output frequency $S_{output}$ is K·X/N times the input frequency $S_{input}$. Since K·X/N can be an irrational value, the frequency following system of this embodiment is thus able to generate an output frequency that is an irrational multiple of the input frequency.

In order to ensure proper operation of the frequency following system, the frequency of the reset signal input to the frequency counter 110 should be less than the frequency of the signal being counted by the frequency counter 110. Therefore, in the case of FIG. 1, the input frequency $S_{input}$ should be less than output frequency $S_{output}$; and in the case of FIG. 2, the output frequency of the first frequency divider 210 should be less than the output frequency of the second frequency divider 220 (i.e., the input frequency $S_{input}$ should be less than N/X times the output frequency $S_{output}$.

In conclusion, the all-digital frequency following system of the invention has the following advantages. First, the semiconductor integrated circuit that implements the all-digital frequency following system of the invention can include fewer than 500 silicon gate electrodes. Second, the invention allows the output frequency to be either an integral multiple or an irrational multiple of the input frequency based on various embodiments of the invention. Third, the invention allows the use of low-frequency transistors to provide high-frequency clock signal (i.e., the output frequency $S_{output}$) for use by CD-ROM drive systems.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An all-digital frequency following system capable of generating an output frequency which is an integral multiple of an input frequency, comprising:

a frequency counter having a first input end receiving said input frequency as a reference signal which resets said frequency counter at the start of each cycle of the input frequency and a second input end receiving the output frequency of said frequency following system as a feedback to thereby count the number of pulses in the output frequency, said frequency counter holding the output count when the count reaches a preset upper limit, wherein said frequency counter is a 7-bit counter comprising flip-flop means for generating the 7-bit count in response to the output frequency and logic means capable of generating a hold signal when the 7-bit count reaches the preset upper limit, the hold signal causing said flip-flop means to maintain their output bits at current logic state;

a digital comparator which latches the output of said frequency counter at the start of each cycle of the input frequency and then compares the latched value with a first predetermined value; said digital comparator generating a first logic level trigger signal if the latched value is greater than the first predetermined value, and a second logic level trigger signal if the latched value is less than the first predetermined value;

an up/down counter whose count range is set between an upper limit and a bottom limit and whose initial count is set at a second predetermined value which is increased by one when the first logic level trigger signal is received from said digital comparator and decreased by one when the second logic level trigger signal is received from said digital comparator; when the count of said up/down counter reaches either the upper limit or the bottom limit, the output of said up/down counter is held at that limit; and a digitally-controlled oscillator capable of generating an output signal serving as the output frequency whose value is in proportion to the output of said up/down counter.

2. The system of claim 1, wherein said up/down counter is a 5-bit up/down counter including:

flip-flop means for generating the 5-bit count in the up direction when receiving the first logic level trigger signal from said digital comparator and in the down direction when receiving the second logic level trigger signal from said digital comparator;

first logic means capable of generating a first hold signal when the 5-bit count reaches the upper limit, the first hold signal causing said flip-flop means to maintain their output bits at current logic state; and second logic means capable of generating a second hold signal when the 5-bit count reaches the bottom limit, the second hold signal causing said flip-flop means to maintain their output bits at current logic state.

3. The system of claim 1, wherein said digitally-controlled oscillator includes:

a delay element, receiving the output of said up/down counter, for delaying the output of said up/down counter by a delay time in proportion to the value of the output of said up/down counter; and an inverter having an input end coupled to the output of said delay element for inverting the output of said delay element.

4. The system of claim 1, wherein in said digital comparator, the first predetermined value is set by programmable means to equal to the ratio of the desired output frequency to the input frequency.

5. An all-digital frequency following system capable of generating an output frequency which is a multiple of an input frequency, comprising:

a first frequency divider, receiving the input frequency as input, for dividing the input frequency by a first divisor;

a second frequency divider, receiving the output frequency of said frequency following system as input, for dividing the output frequency of said frequency following system by a second divisor;

a frequency counter having a first input end receiving the output of said first frequency divider as a reference signal which resets said frequency counter at the start of each cycle of the output of said first frequency divider and a second input end receiving the output of said second frequency divider as a feedback to thereby count the number of pulses in the output of said second frequency divider, said frequency counter holding the output count when the count reaches a preset upper limit wherein said frequency counter is a 7-bit counter comprising flip-flop means for generating the 7-bit count in response to the output frequency and logic means capable of generating a hold signal when the 7-bit count reaches the preset upper limit, the hold signal causing said flip-flop means to maintain their output bits at current logic state;

a digital comparator which latches the output of said frequency counter at the start of each cycle of the output of said first frequency divider and then compares the latched value with a first predetermined value; said digital comparator generating a first logic level trigger signal if the latched value is greater than the first predetermined value, and a second logic level trigger signal if the latched value is less than the first predetermined value;

an up/down counter whose count range is set between an upper limit and a bottom limit and whose initial count is set at a second predetermined value which is increased by one when the first logic level trigger signal is received from said digital comparator and decreased by one when the second logic level trigger signal is received from said digital comparator; when the count of said up/down counter reaches either the upper limit or the bottom limit, the output of said up/down counter is held at that limit; and a digitally-controlled oscillator capable of generating an output signal serving as the output frequency whose value is in proportion to the output of said up/down counter.

6. The system of claim 5, wherein said up/down counter is a 5-bit up/down counter including:

flip-flop means for generating the 5-bit count in the up direction when receiving the first logic level trigger signal from said digital comparator and in the down direction when receiving the second logic level trigger signal from said digital comparator;

first logic means capable of generating a first hold signal when the 5-bit count reaches the upper limit, the first hold signal causing said flip-flop means to maintain their output bits at current logic state; and second logic means capable of generating a second hold signal when the 5-bit count reaches the bottom limit, the second hold signal causing said flip-flop means to maintain their output bits at current logic state.

7. The system of claim 5, wherein said digitally-controlled oscillator includes:

a delay element, receiving the output of said up/down counter, for delaying the output of said up/down counter by a delay time in proportion to the value of the output of said up/down counter; and an inverter having an input end coupled to the output of said delay element for inverting the output of said delay element.

8. The system of claim 5, wherein the first predetermined value, the first divisor of said first frequency divider and the second divisor of said second frequency divider are set by programmable means in such a manner that the result of the multiplication of the first predetermined value and the second divisor of said second frequency divider being divided by the first divisor of the first frequency divider is equal to the ratio of the desired output frequency to the input frequency.

* * * * *